United States Patent [19]

Chan et al.

[11] Patent Number: 5,082,797

[45] Date of Patent: Jan. 21, 1992

[54] METHOD OF MAKING STACKED TEXTURED CONTAINER CAPACITOR

[75] Inventors: Hiang C. Chan; Pierre Fazan; Yauh-Ching Liu, all of Boise, Id.

[73] Assignee: Micron Technology, Inc., Boise, Id.

[21] Appl. No.: 645,086

[22] Filed: Jan. 22, 1991

[51] Int. Cl.$^5$ .................................... H01L 21/70
[52] U.S. Cl. .................................... 437/52; 437/47; 437/48; 437/60; 437/228; 437/233; 437/919; 357/23.6
[58] Field of Search ............. 437/47, 48, 52, 60, 437/191, 193, 195, 228, 233, 235, 919; 357/23.6, 51

[56] References Cited

FOREIGN PATENT DOCUMENTS 0278363 11/1988 Japan.
0042161 2/1989 Japan.
0264251 10/1989 Japan.

OTHER PUBLICATIONS

"A Spread Stacked Capacitor (SSC) Cell for 64MBIT Drams" by S. Inoue, et al., IEDM 89-31, pp. 31-34.
"3-Dimensional Stacked Capacitor Cell for 16M and 64M Drams" by T. Ema et al., IEDM 88, pp. 592-595.

Primary Examiner—Brian E. Hearn
Assistant Examiner—Tom Thomas
Attorney, Agent, or Firm—David J. Paul

[57] ABSTRACT

A stacked textured container capacitor (STCC) using a modified stacked capacitor storage cell fabrication process. The STCC is made up of a texturized polysilicon structure, having an elongated u-shaped cross-section, located at a buried contact and extending to an adjacent storage node overlaid by polysilicon with a dielectric sandwiched in between. With the 3-dimensional shape and texturized surface of a polysilicon storage node plate substantial capacitor plate surface area of 200% or more is gained at the storage node.

15 Claims, 10 Drawing Sheets

METHOD OF MAKING STACKED TEXTURED CONTAINER CAPACITOR

FIELD OF THE INVENTION

This invention relates to semiconductor circuit memory storage devices and more particularly to a process to develop texturized three-dimensional stacked cell capacitors used in high-density dynamic random access memory (DRAM) arrays.

BACKGROUND OF THE INVENTION

In dynamic semiconductor memory storage devices, it is essential that storage node capacitor cell plates be large enough to retain an adequate charge or capacitance in spite of parasitic capacitances and noise that may be present during circuit operation. As is the case for most semiconductor integrated circuitry, circuit density is continuing to increase at a fairly constant rate. The issue of maintaining storage node capacitance is particularly important as the density of DRAM arrays continue to increase for future generations of memory devices.

The ability to densely pack storage cells while maintaining required storage capabilities is a crucial requirement of semiconductor manufacturing technologies if future generations of expanded memory array devices are to be successfully manufactured.

One method of maintaining, as well as increasing, storage node size in densely packed memory devices is through the use of "stacked storage cell" design. With this technology, two layers of a conductive material such as polycrystalline silicon (polysilicon or poly) are deposited over an access device on a silicon wafer with dielectric layers sandwiched between each poly layer. A cell constructed in this manner is known as a stacked capacitor cell (STC). Such a cell utilizes the space over the access device for capacitor plates, has a low soft error rate (SER) and may be used in conjunction with inter-plate insulative layers having a high dielectric constant.

However, it is difficult to obtain sufficient storage capacitance with a conventional STC capacitor as the storage electrode area is confined within the limits of its own cell area. Also, maintaining high dielectric breakdown characteristics between poly layers in the STC capacitor becomes a major concern once insulator thickness is appropriately scaled.

A paper submitted by T. Ema, S. Kawanago, T. Nishi, S. Yoshida, H. Nishibe, T. Yabu, Y. Kodama, T. Nakano and M. Taguchi, entitled "3 - DIMENSIONAL STACKED CAPACITOR CELL FOR 16 M AND 64 M DRAMS," IEDM, Dig. Tech. Papers, pp. 592-595, 1988, herein incorporated by reference, discusses a 3 - dimensional stacked capacitor fin structure.

The fin structure and its development is shown in FIG. 1, pp. 593 of the article mentioned above. The storage node is formed by two polysilicon layers, called fins, with gaps between the fins (the number of fins can be increased, but is limited by design rules used). Capacitor dielectric film surrounds the whole surface of the polysilicon fins (used for a capacitor cell plate) covering the fins and filling in the gaps. This design can be fabricated using current methods and increases storage capacitance, but it is not suitable for a deep submicron (such as 0.2 micron) design rule DRAM cell because the total thickness of several fins making up the cell plate is much larger than minimum feature size. In addition, the process flow needed to realize this fin structure requires precise alignment between two adjacent word lines and digits lines. This alignment along with the requirement to have the storage node poly overlap the storage node contact leads to a larger cell area that is not suitable for 0.2 micron design rules mentioned previously.

Also, in a paper submitted by S. Inoue, K. Hieda, A. Nitayama, F. Horiguchi and F. Masuoka, entitled "A SPREAD STACKED CAPACITOR (SSC) CELL FOR 64MBIT DRAMS," IEDM, Dig. Tech. Papers, pp. 31-34, 1989, herein incorporated by reference, discusses a storage electrode of a 1st memory cell being expanded to the neighboring 2nd memory cell area.

The SSC cell fabrication process (refer to FIG. 2 pp. 32) begins with a storage electrode deposited above the digit lines that is expanded from the 1st memory cell to its adjacent memory cells and visa versa. This results in a stacked capacitor arrangement where each storage electrode can occupy two memory cell areas, thus almost doubling the storage capacitance of one memory cell.

However, the SSC process is complicated and adds at least two masks to the standard process and cannot be made with self-aligned contacts.

The present invention develops an existing stacked capacitor fabrication process to construct a texturized three-dimensional stacked capacitor cell by using self aligned contacts without additional photolithography steps.

SUMMARY OF THE INVENTION

The invention is directed to maximizing storage cell surface area in a high density/high volume DRAM (dynamic random access memory) fabrication process. An existing stacked capacitor fabrication process is modified to construct a three-dimensional stacked textured container capacitor (STCC) defined as a storage cell.

After a silicon wafer is prepared using conventional process steps, the present invention develops the STCC by creating a u-shaped texturized poly structure having elongated poly spacer walls conforming to the topology formed by three adjacent word lines running perpendicular to two adjacent digit lines, which results in increased capacitor plate surface area for each storage cell. Such a structure has the potential to increase the capacitance of a conventional STC cell by 200% or more.

DETAILED DESCRIPTION OF THE PREFERRED EMBODIMENT

The invention is directed to maximizing storage cell surface area in a high density/high volume DRAM fabrication process, in a sequence shown in FIGS. 1-11.

A silicon wafer is prepared using conventional process steps up to the point of defining a cell array. Capacitor fabrication will now follow.

The capacitor of each cell will make contact with a buried contact within the cell, while the capacitor will extend to the active area of an adjacent cell. Each active area within the array is isolated from one another by a thick field oxide and arranged in interdigitated columns and non-interdigitated rows. The active areas are used to form active MOS transistors that can be doped as NMOS or PMOS type FETs depending on the desired use.

Figure 1:
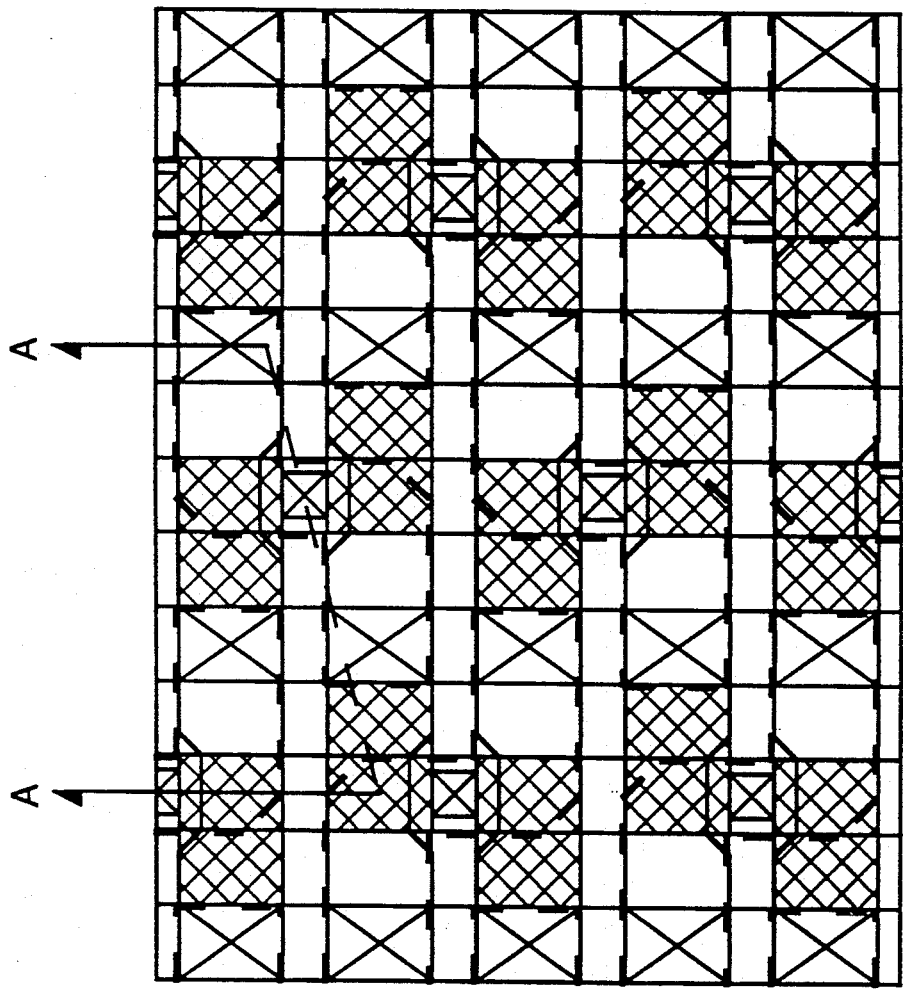
FIG. 1 is a top planar view of a portion of an in-process wafer showing digit lines, word lines, active areas and storage capacitors.

FIG. 1 shows a top planar view portion of a completed multilayered memory array with the main building blocks comprising digit lines 47, word lines 28, active area 21, and STCC storage mode plates 92. Active areas 21 have been implanted in such a manner as to have each adjacent active area interweave with one another in the row direction (defined by parallel word lines 28) thereby forming parallel interdigitated rows of active areas 21. In the column direction (defined by parallel digit lines 47) each adjacent active area 21 run end to end thereby forming parallel non-interdigitated columns, of active areas 21. The stacked capacitor structure of the preferred embodiment (the STCC) is self-aligned to word lines 28 as well as to digit lines 47.

Figure 2:
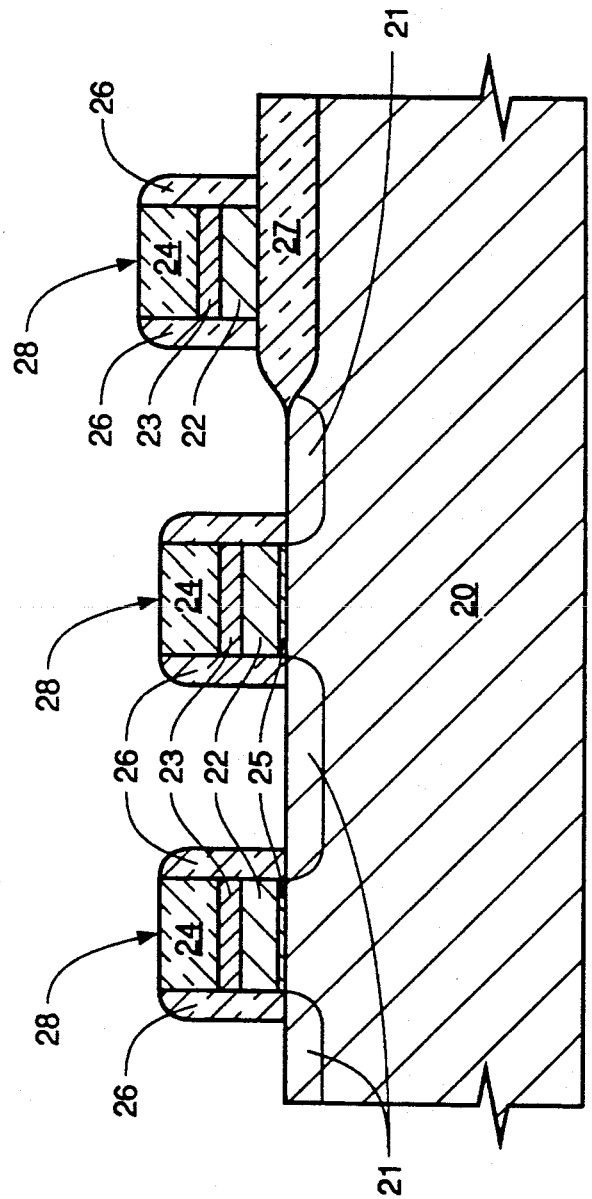
FIG. 2 is a cross-sectional view through broken line A—A of FIG. 1.

As shown in FIG. 2, parallel word lines 28 made up of poly 22, covered with silicide 23 and dielectric 24 (either oxide or nitride). Word lines 28 and further isolated from subsequent conductive layers by dielectric spacers 26 (also either oxide or nitride), have been previously deposited over a thin layer of gate oxide 25 or a thick layer of field oxide 27. Active areas 21 have been appropriately doped to a desired conductivity type which penetrates into the bulk silicon wafer 20, by conventional process steps. Now the wafer is ready for digit line formation that will run perpendicular to word lines 28.

Figure 3:
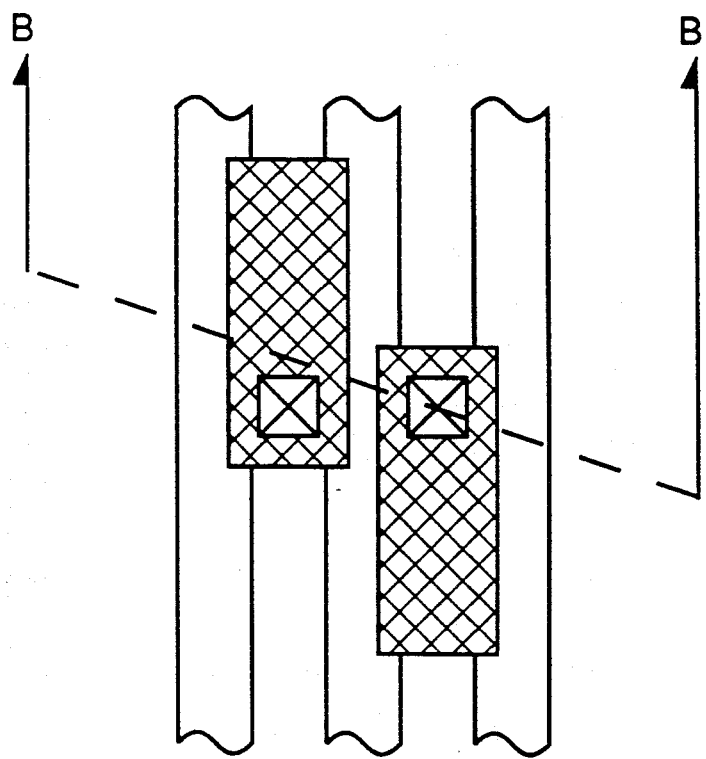
FIG. 3 is a top planar view of a portion of an in-process wafer showing digit lines, storage node contacts and storage capacitors.

FIG. 3 shows a top planar view of a portion of an in-process wafer showing active areas 21, digit lines 47, storage node contacts 57 and storage mode plates 92.

Figure 4:
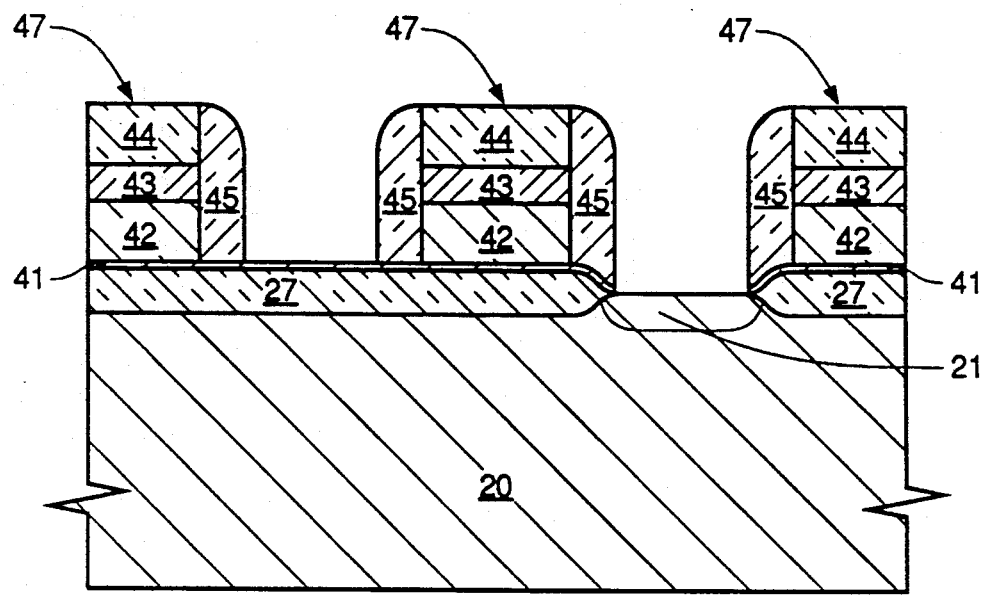
FIG. 4 is a cross-sectional view of the in-process wafer through broken line B—B of FIG. 3 following deposition and etching of digit line vertical dielectric spacers.

As shown in FIG. 4, oxide layer 41 is deposited over the entire wafer array surface followed by buried digit line contacts patterning and etch. Blanket depositions of polysilicon 42, silicide 43 and dielectric 44 are performed, respectively. Dielectric 44 can be either nitride or oxide and is deposited by chemical vapor deposition (CVD) which is preferred for its excellent conformity. The layers of polysilicon 42, silicide 43 and dielectric 44 are patterned and etched with polysilicon 42, previously being conductively doped, to serve as parallel digit lines 47. Digit lines 47 run perpendicular to word lines 28 (shown in FIG. 2) and conform to the wafer surface resulting in a waveform-like topology running in both the digit line and word line directions. A second dielectric, such as nitride or oxide is now deposited, preferably by CVD, followed by an anisotropic etch to form vertical dielectric spacers 45.

Figure 5:
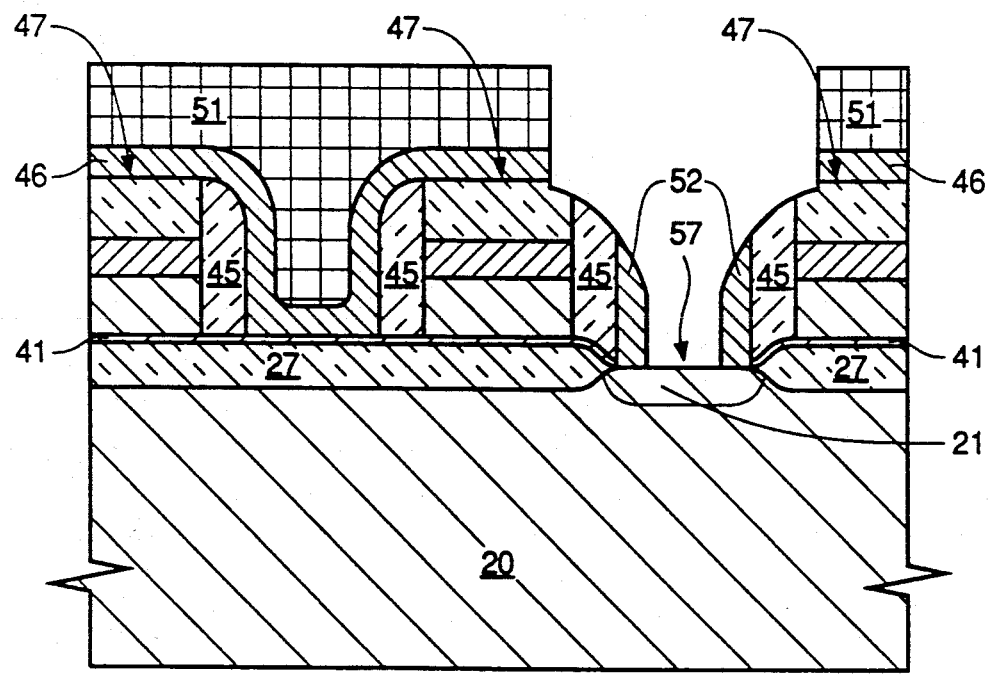
FIG. 5 is a cross-sectional view of the in-process wafer portion of FIG. 4 after conformal dielectric deposition, followed by a buried contact photo and etch.

As shown in FIG. 5, digit lines 47 and their subsequent isolation layers are then covered with a nitride dielectric 46 to a preferred thickness of 500 to 2000 angstroms, preferably by CVD. Subsequently, a buried contact 57, self-aligned to digit lines 42 by the presence of spacers 45, is located by covering all areas other than contact 57 location with photoresist 51. After applying an appropriate photomask, a buried contact anisotropic etch on the exposed dielectric creates additional nitride spacers 52 and provides an opening to locate contact 57.

Up to this point, process flow has followed that of an array comprising conventional stacked capacitor cells. From this point forward, the process is unique to an array having STCC-type storage capacitors.

Figure 6:
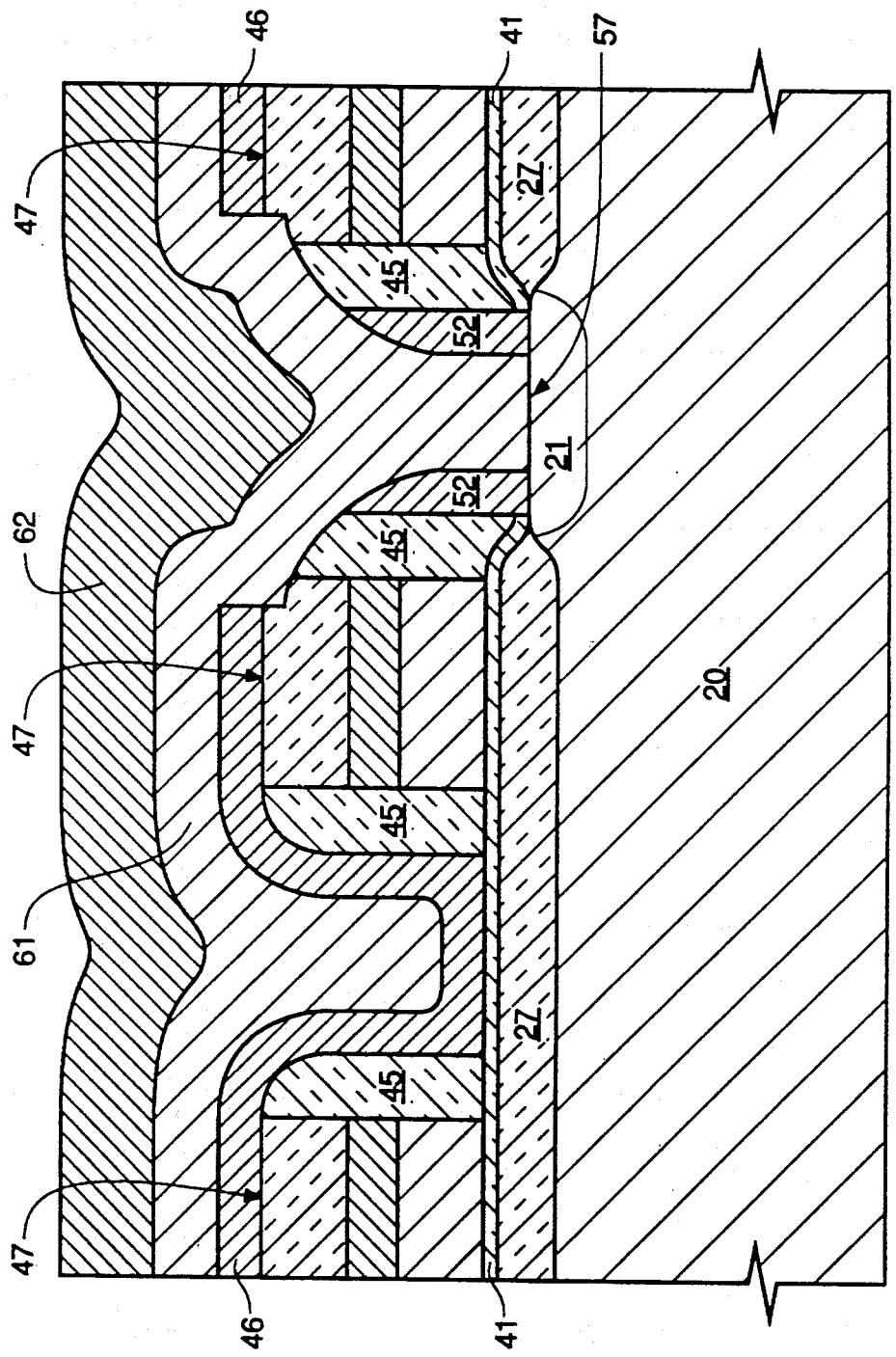
FIG. 6 is a cross-sectional view of the in-process wafer portion of FIG. 5 following a photoresist strip, and a blanket deposition of conformal poly, poly doping and a blanket deposition of thick nitride.

As shown in FIG. 6, the photoresist 51 (of FIG. 5) has been stripped and a conformal poly layer 61 is deposited over the entire array surface and couples to active area 21 via buried contact 57. Following poly 61 deposition a conformal layer of thick nitride (nitride deposited 2000 to 6000 angstroms thick is preferred) dielectric 62 is deposited, preferably by CVD.

Figure 7:
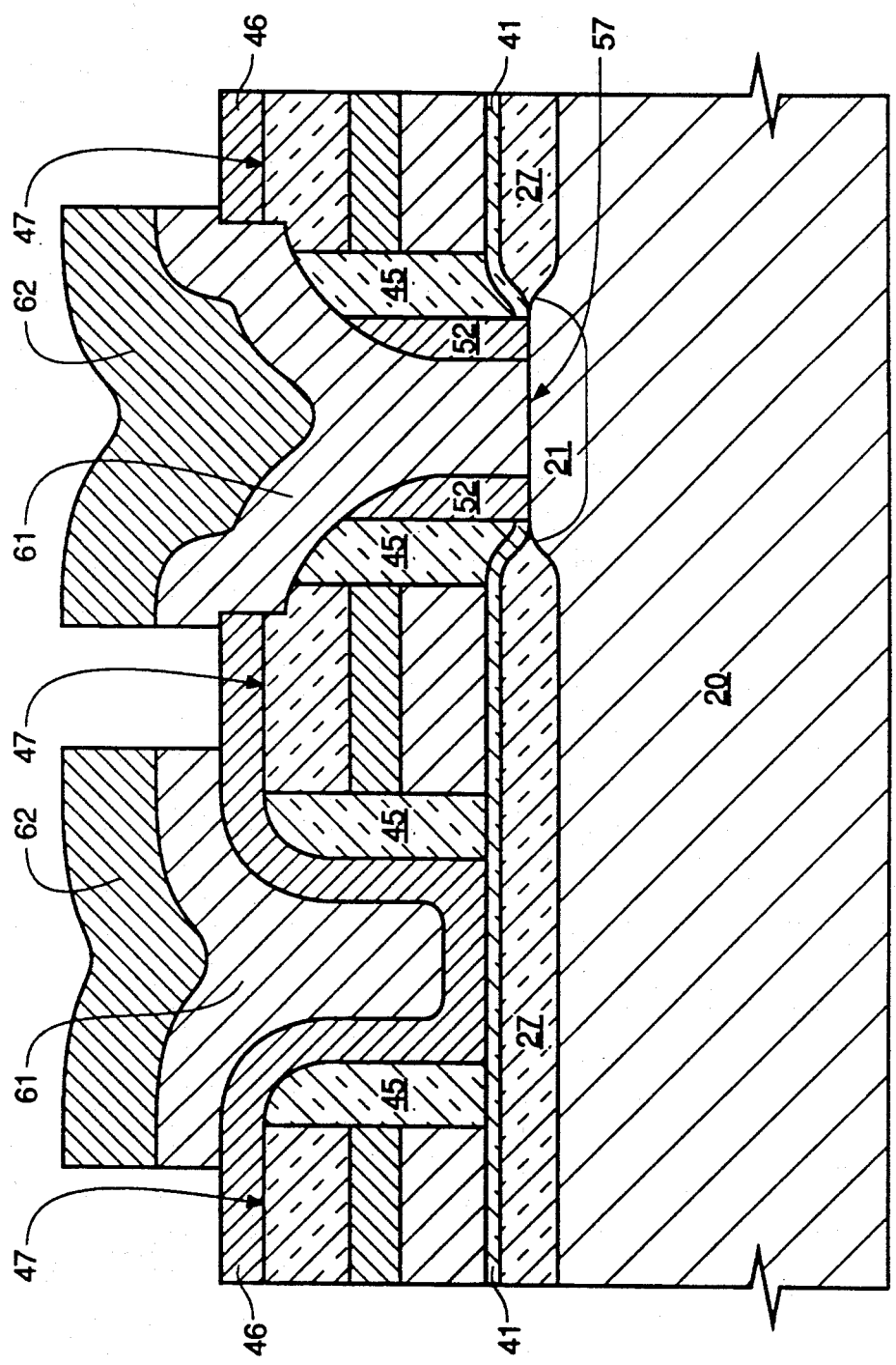
FIG. 7 is a cross-sectional view of the in-process wafer portion of FIG. 6 following patterning of a poly storage node.

As shown in FIG. 7, poly layer 61 and oxide 62 are patterned to serve as a portion of a storage node plate of the STCC storage capacitor. Poly plate 61 extends over an adjacent poly word line (the word line is not shown as it runs parallel to the cross-sectional view of FIG. 7) and continues to the next adjacent word line. Plate 61 conforms to the two perpendicular waveform-like topologies (created after digit line formation) which run in both the word lines and the digit lines directions.

Figure 8:
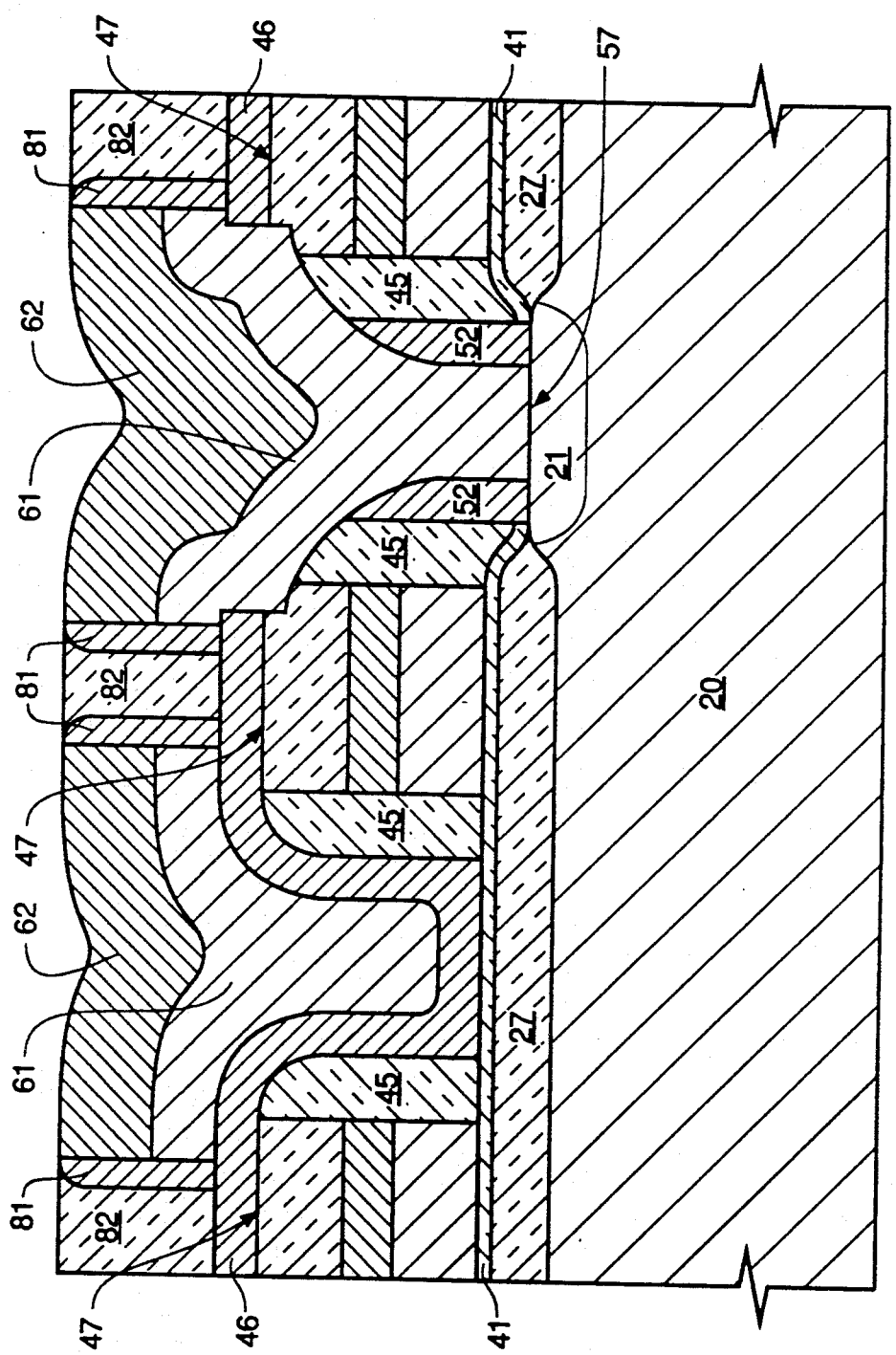
FIG. 8 is a cross-sectional view of the in-process wafer portion of FIG. 7 after nitride deposition, nitride spacer etch followed by oxide deposition and planarization.

As shown in FIGS. 8, a layer of nitride is deposited and then anisotropically etched to form nitride spacers 81. Following spacer 81 etch, oxide 82 is deposited and planarized and used as an oxide filler to maintain the gaps between nitride spacers 81.

Figure 9:
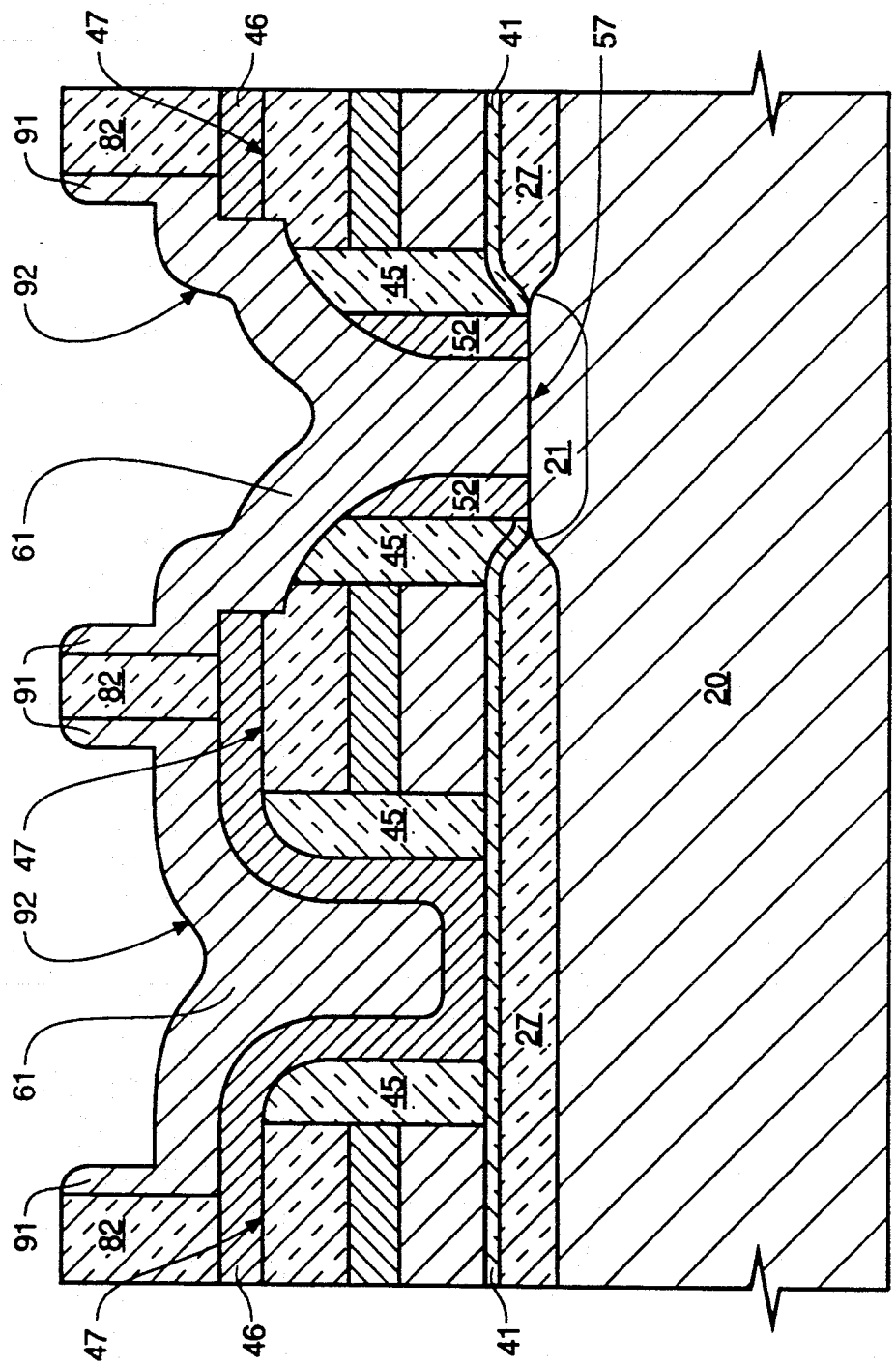
FIG. 9 is a cross-sectional view of the in-process wafer portion of FIG. 8 after a controlled nitride wet etch followed by conformal poly deposition and poly spacer etch.

As shown in FIG. 9, nitride spacers 81 and nitride layer 62 (of FIG. 8) have been removed with a controlled nitride wet etch. A layer of conformal poly is deposited and then anisotropic etch is performed to form poly spacer walls 91. Poly spacer walls 91 attach to poly 61 thus extending poly plate 61 in a substantially vertical direction and form an elongated u-shaped poly structure 92. In addition, both sides of spacer walls 91 are available to gain additional capacitance after a filler oxide etch that follows is performed.

Figure 10:
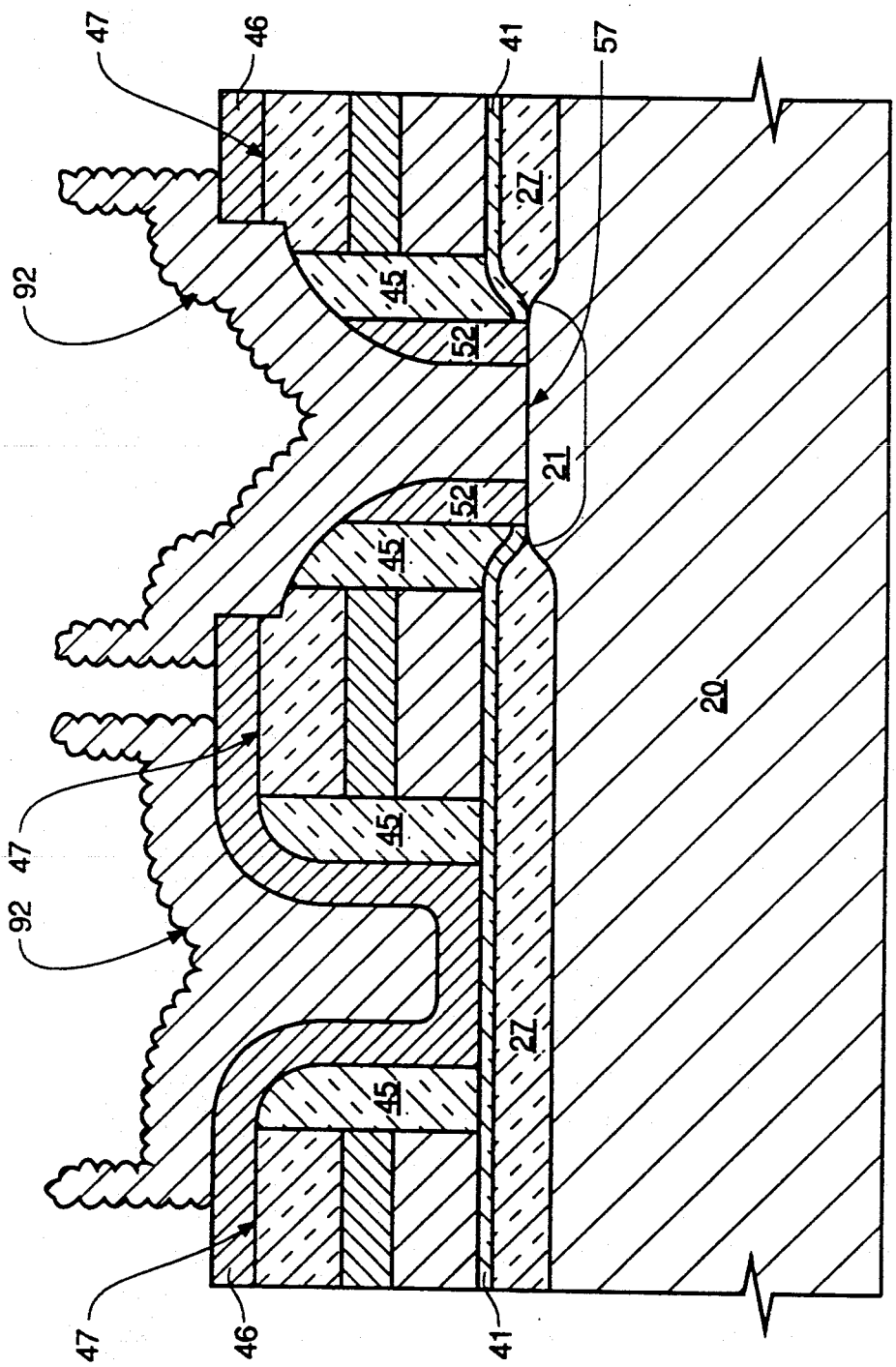
FIG. 10 is a cross-sectional view of the in-process wafer portion of FIG. 9 after a support oxide wet etch followed by poly texturizing using wet oxidation and an oxide wet etch.

As shown in FIG. 10, filler oxide 82 (shown in FIG. 9) has been removed by a oxide wet etch. Poly structure 92 is subjected to wet oxidation which is then removed with a second wet oxide etch thus causing poly structure 92 to take on a texturized surface. The texturized poly structure 92 will serve as a completed storage node plate for the STCC cell. By texturizing structure 92 the poly surface area the storage node plate is increased (potentially by 200%) which in turn increases the storage node capacitance. Another advantage of a textured node plate allows for a designer to shorten poly extensions 91 (also shown in FIG. 9) and still maintain the desired capacitance required.

Figure 11:
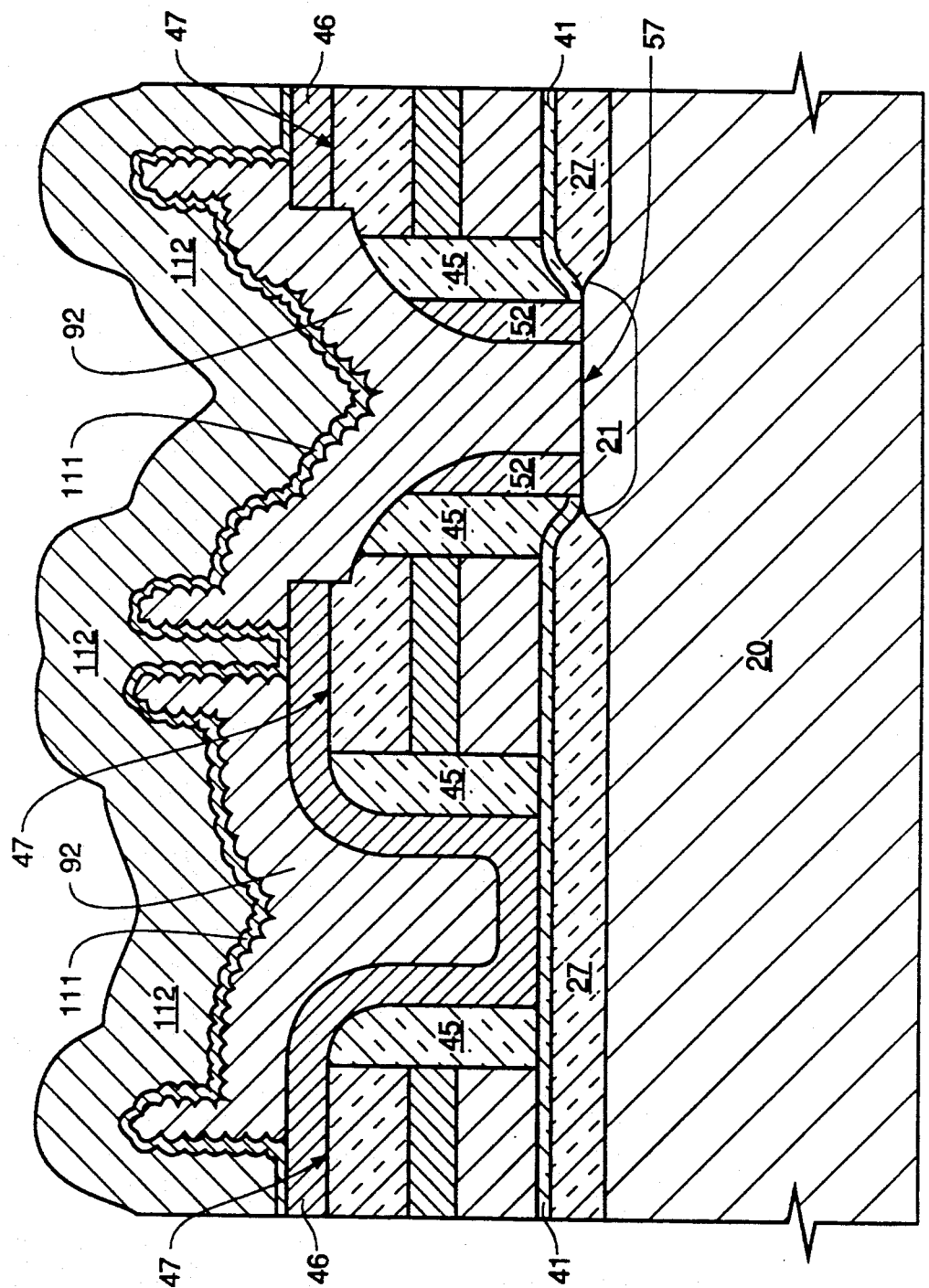
FIG. 11 is a cross-sectional view of the in-process wafer portion of FIG. 10 after cell dielectric deposition followed by top poly plate deposition.
Figure 1:
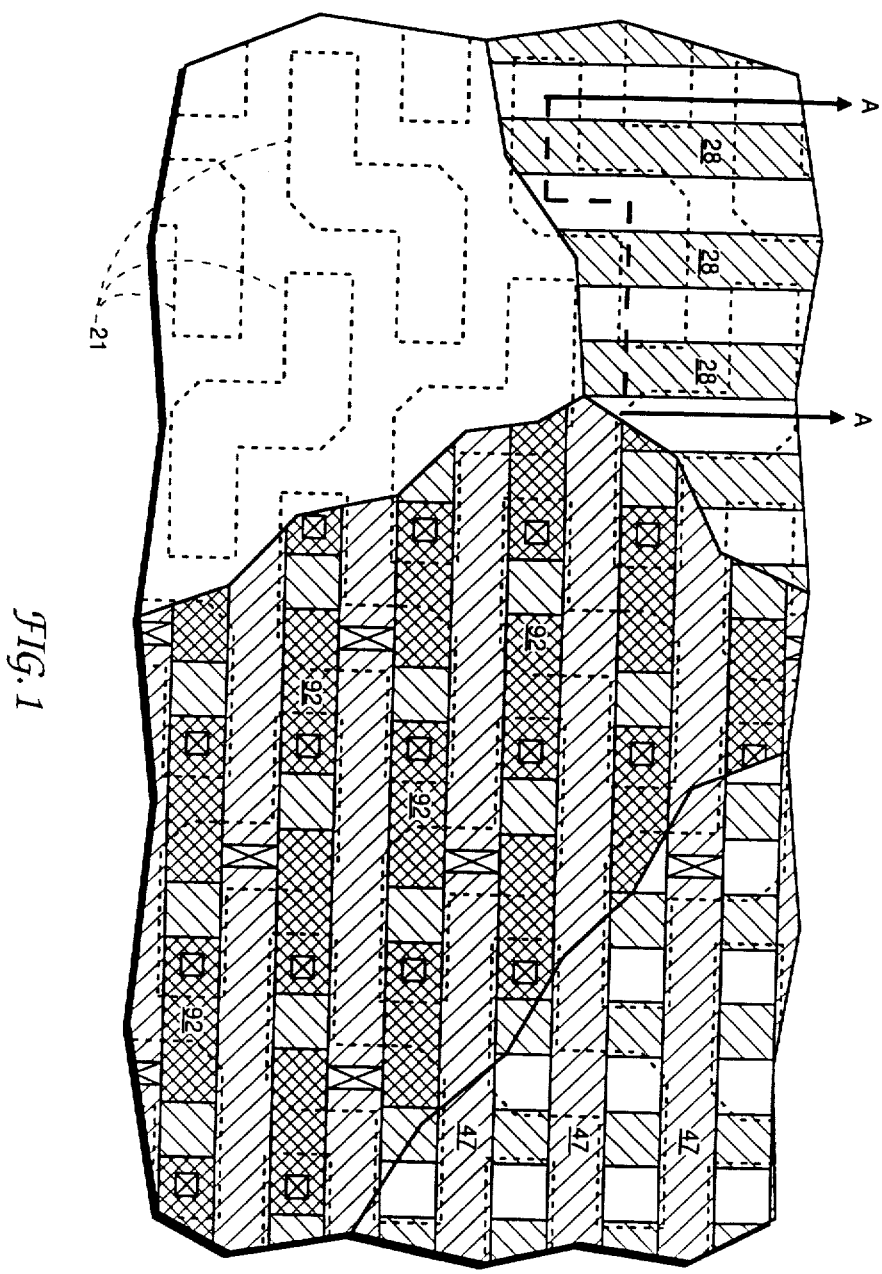
Figure 3:
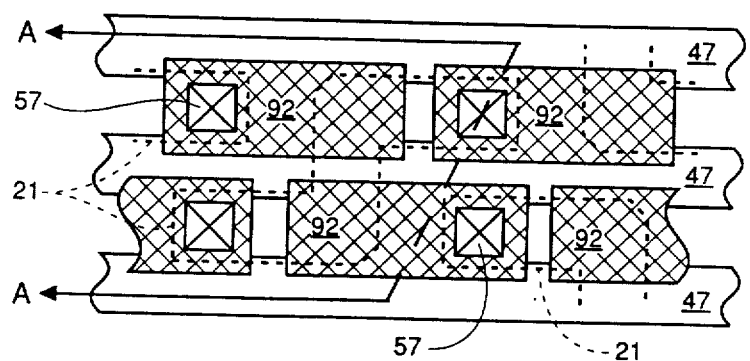

As shown in FIG. 11, a layer of dielectric 111 having a high dielectric constant is deposited that conforms to poly structure 92. Many dielectrics could be used with nitride, oxidized nitride and Ta2O5 being a few examples. Dielectric 111 serves as a capacitor dielectric for the STCC cell. Following dielectric 111 deposition, a blanket deposition of conformal poly 112 is deposited. Poly structure 92 and poly 112 are conductively doped either n-type or p-type depending on the conductivity type desired for active area 21. Poly 112 now serves as a top poly capacitor cell plate of the STCC storage capacitor which also becomes a common cell plate to all STCC storage capacitors in the array.

With the 3-dimensional shape and texturized surface of poly plate 92 as the storage node plate along with top poly capacitor cell plate 112 that envelops plate poly structure 92 and dielectric 111, substantial capacitor plate surface area is gained at the storage node. Because capacitance is mainly affected by surface area of a capacitor's cell plates, the area gained can provide an additional 200% or more increase in capacitance over that of a conventional STC capacitor, without more space than that required for defining a stacked capacitor storage cell.

It is to be understood that although the present invention has been described with reference to a preferred embodiment, various modifications, known to those skilled in the art, may be made to the structures and process steps presented herein without departing from the invention as recited in the several claims appended hereto.

We claim:

1. A process for fabricating a DRAM array on a silicon substrate, said process comprising the following sequence of steps:

creating a plurality of separately isolated active areas arranged in parallel interdigitated rows and parallel non-interdigitated columns;

creating a gate dielectric layer on top of each active area;

depositing a first conductive layer superjacent surface of said array;

depositing a first dielectric layer superjacent said first conductive layer;

masking and etching said first conductive and said first dielectric layers to form a plurality of parallel conductive word lines aligned along said rows such that each said word line passes over a inner portion of each said active area being separated therefrom by a remanent of said gate dielectric layer;

creating of a conductively-doped digit line junction and storage node junction within each said active area on opposite sides of each said word line;

depositing a second dielectric layer superjacent said array surface;

creating a first aligned buried contact location at each said digit line junction in each said active area;

depositing a second conductive layer superjacent said array surface, said second conductive layer making direct contact to said digit line junctions at said first buried contact locations;

depositing a third dielectric layer superjacent to said second conductive layer;

masking and etching said second conductive layer and said third dielectric layer to form a plurality of parallel conductive digit lines aligned along said columns such that a digit line makes electrical contact at each digit line junction within a column, said digit lines running perpendicular to and over said word lines forming a 3-dimensional, waveform-like topology;

depositing a first nitride layer superjacent said array surface of said waveform-like topology;

creating a second aligned buried contact location at each said storage node junction in each said active area;

depositing a third conductive layer superjacent said array surface assuming said waveform-like topology in response to existing topology, said third conductive layer making contact to said storage node junctions at said second buried contact locations;

depositing a second nitride layer;

patterning said third conductive layer and said second nitride layer to form a portion of a poly storage node plate at each said storage node junction, said poly storage node plate having a u-shaped cross-section;

depositing a third nitride layer;

etching said third nitride layer thereby forming vertical nitride spacers superjacent to vertical sides of said poly storage node plate and said second dielectric;

depositing a first oxide layer;

planarizing said first oxide layer thereby forming oxide fillers between said vertical nitride spacers;

etching said first nitride layer and said nitride spacers;

depositing a fourth conductive layer adjacent and coextensive with existing topology;

etching said fourth conductive layer thereby forming vertical poly spacer walls adjacent to said oxide fillers, said spacer walls attaching to said third conductive layer thereby forming a poly storage node plate having an elongated u-shaped cross-section;

etching said oxide fillers;

texturizing said poly storage node plate;

depositing a cell dielectric layer adjacent and coextensive with said storage node plate and adjacent said array surface; and depositing a fifth conductive layer adjacent and coextensive with said cell dielectric layer to form a cell plate common to the entire memory array.

2. A process as recited in claim 1, wherein said gate dielectric layer is oxide.

3. A process as recited in claim 1, wherein said first and said second conductive layers comprise a layer of tungsten silicide and doped polysilicon.

4. A process as recited in claim 1, wherein said first, said second and said fourth dielectric layers are selected from the group consisting essentially of oxide or nitride.

5. A process as recited in claim 1, wherein said first and said second buried contacts are self aligned.

6. A process as recited in claim 1, wherein said third, said fourth and said fifth conductive layers are doped polysilicon.

7. A process as recited in claim 1, wherein said first, said second, and said third dielectric layers are deposited by chemical vapor deposition.

8. A process as recited in claim 1, wherein said first nitride layer is deposited by chemical vapor deposition.

9. A process as recited in claim 1, wherein said first nitride layer is deposited to a thickness of 2000 to 6000 angstroms.

10. A process as recited in claim 1, wherein said etching of third nitride layer to form said vertical spacers is accomplished by an anisotropic etch.

11. A process as recited in claim 1, wherein said etching of first nitride layer and said vertical nitride spacers is accomplished by a controlled wet nitride etch.

12. A process as recited in claim 1, wherein said etching of fourth conductive layer to form said vertical poly spacer walls is accomplished by an anisotropic etc.

13. A process as recited in claim 1, wherein said texturizing comprises the steps of:
a) subjecting said poly storage node plate to wet oxidation; and
b) performing an oxide wet etch thereby forming said texturized poly storage node plate.

14. A process as recited in claim 1, wherein said cell dielectric layer is material having a high dielectric constant.

15. A process as recited in claim 14, wherein said layer cell dielectric material is selected from the group consisting essentially of nitride, oxidized nitride and Ta2O5.

* * * * *

UNITED STATES PATENT AND TRADEMARK OFFICE
CERTIFICATE OF CORRECTION

PATENT NO. : 5,082,797

DATED : January 21, 1992

INVENTOR(S) : Pierre Fazan, et al

It is certified that error appears in the above-identified patent and that said Letters Patent is hereby corrected as shown below:

The drawing sheets consisting of Figs. 1 and Figs. 3, should be deleted to be replaced with the drawing sheets, consisting of Figs. 1 and Figs. 3, as shown on the attached page.

Signed and Sealed this

Sixth Day of July, 1993

Attest:

MICHAEL K. KIRK

Attesting Officer

Acting Commissioner of Patents and Trademarks